US011859275B2

(12) United States Patent
Shah et al.

(10) Patent No.: US 11,859,275 B2
(45) Date of Patent: Jan. 2, 2024

(54) TECHNIQUES TO IMPROVE ADHESION AND DEFECTS FOR TUNGSTEN CARBIDE FILM

(71) Applicant: Applied Materials, Inc., Santa Clara, CA (US)

(72) Inventors: Vivek Bharat Shah, Sunnyvale, CA (US); Anup Kumar Singh, Santa Clara, CA (US); Bhaskar Kumar, Santa Clara, CA (US); Ganesh Balasubramanian, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 126 days.

(21) Appl. No.: 16/960,277

(22) PCT Filed: Jan. 3, 2019

(86) PCT No.: PCT/US2019/012143
§ 371 (c)(1),
(2) Date: Jul. 6, 2020

(87) PCT Pub. No.: WO2019/139809
PCT Pub. Date: Jul. 18, 2019

(65) Prior Publication Data
US 2021/0108309 A1 Apr. 15, 2021

Related U.S. Application Data

(60) Provisional application No. 62/617,376, filed on Jan. 15, 2018.

(51) Int. Cl.
*C23C 16/02* (2006.01)
*C23C 16/32* (2006.01)
(Continued)

(52) U.S. Cl.
CPC .......... *C23C 16/0272* (2013.01); *C23C 16/32* (2013.01); *C23C 16/45557* (2013.01); *C23C 16/513* (2013.01); *C23C 16/52* (2013.01)

(58) Field of Classification Search
CPC ................ C23C 16/0272; C23C 16/32; C23C 16/45557; C23C 16/513; C23C 16/52
See application file for complete search history.

(56) References Cited

U.S. PATENT DOCUMENTS 4,980,201 A * 12/1990 Tokunaga ............... C23C 16/32
427/249.18
5,821,169 A 10/1998 Nguyen et al.
(Continued)

FOREIGN PATENT DOCUMENTS

JP S61084375 A 4/1986
JP H03-291379 A 12/1991
(Continued)

OTHER PUBLICATIONS

International Search Report and Written Opinion for International Application No. PCT/US2019/012143 dated Apr. 24, 2019.
(Continued)

*Primary Examiner* — Michael G Miller
(74) *Attorney, Agent, or Firm* — PATTERSON + SHERIDAN, LLP; Chad M. Dougherty (57) ABSTRACT

Implementations of the present disclosure generally relate to hardmask films and methods for depositing hardmask films. More particularly, implementations of the present disclosure generally relate to tungsten carbide hardmask films and processes for depositing tungsten carbide hardmask films. In one implementation, a method of forming a tungsten carbide film is provided. The method comprises forming a tungsten carbide initiation layer on a silicon-containing surface of a substrate at a first deposition rate. The method further comprises forming a tungsten carbide film on the tungsten
(Continued)

carbide initiation layer at a second deposition rate, wherein the second deposition rate is greater than the first deposition rate.

20 Claims, 3 Drawing Sheets

(51) Int. Cl.
*C23C 16/455* (2006.01)
*C23C 16/513* (2006.01)
*C23C 16/52* (2006.01)

(56) References Cited

U.S. PATENT DOCUMENTS

| | | | |
|---|---|---|---|
| 6,162,715 | A | 12/2000 | Mak et al. |
| 6,198,616 | B1 | 3/2001 | Dahimene et al. |
| 7,659,197 | B1 | 2/2010 | Juliano |
| 8,110,493 | B1 | 2/2012 | Subramonium et al. |
| 8,288,289 | B2 | 10/2012 | Jeong et al. |
| 9,536,734 | B2 | 1/2017 | Hanashima et al. |
| 10,504,727 | B2 | 12/2019 | Wang et al. |
| 2004/0208994 | A1 | 10/2004 | Harkonen et al. |
| 2006/0009024 | A1 | 1/2006 | Lee |
| 2006/0024948 | A1 | 2/2006 | Oh et al. |
| 2007/0026685 | A1 | 2/2007 | Bae et al. |
| 2007/0231010 | A1 | 10/2007 | Ohta et al. |
| 2007/0231487 | A1 | 10/2007 | Ishizaka |
| 2010/0317177 | A1 | 12/2010 | Huang et al. |
| 2012/0264306 | A1 | 10/2012 | Wu et al. |
| 2014/0154883 | A1 | 6/2014 | Humayun et al. |
| 2015/0056805 | A1 | 2/2015 | Park et al. |
| 2015/0228474 | A1 | 8/2015 | Hanashima et al. |
| 2015/0318294 | A1 | 11/2015 | Wang |
| 2016/0027614 | A1 | 1/2016 | Manna et al. |
| 2016/0035569 | A1 | 2/2016 | Rumer et al. |
| 2016/0049323 | A1 | 2/2016 | Ye et al. |
| 2016/0155627 | A1 | 6/2016 | Hanashima et al. |
| 2016/0225632 | A1 | 8/2016 | Shaikh et al. |
| 2016/0284541 | A1 | 9/2016 | Shaikh et al. |
| 2016/0351444 | A1* | 12/2016 | Schloss ............... C23C 16/14 |
| 2017/0186766 | A1 | 6/2017 | Kitao et al. |
| 2017/0207087 | A1* | 7/2017 | Roy ................ H01L 21/0332 |
| 2017/0249211 | A1 | 8/2017 | Hoei et al. |

FOREIGN PATENT DOCUMENTS

| | | |
|---|---|---|
| JP | 2003512527 A | 4/2003 |
| JP | 2016-181687 A | 10/2016 |
| JP | 2017014615 A | 1/2017 |
| KR | 10-2011-0088984 | 8/2011 |
| KR | 10-2016-0140458 A | 12/2016 |

OTHER PUBLICATIONS

Search Report for Taiwan Application No. 107146738 dated Aug. 21, 2019.
Office Action for Taiwan Application No. 107146738 dated Sep. 3, 2019.
Office Action for U.S. Appl. No. 15/695,180 dated Mar. 19, 2019.
Search Report for Taiwan Application No. 106129903 dated May 13, 2019.
International Search Report and Written Opinion for International Application No. PCT/US2017/050105 dated Dec. 15, 2017.
Korean Office Action for Application No. 10-2020-7023475 dated Jul. 19, 2023.
Office Action for Japan Application No. 2020-538727 dated Feb. 7, 2023.

* cited by examiner

TECHNIQUES TO IMPROVE ADHESION AND DEFECTS FOR TUNGSTEN CARBIDE FILM

BACKGROUND

Field

Implementations of the present disclosure generally relate to hardmask films and methods for depositing hardmask films. More particularly, implementations of the present disclosure generally relate to tungsten carbide hardmask films and processes for depositing tungsten carbide hardmask films.

Description of the Related Art

Integrated circuits have evolved into complex devices that can include millions of transistors, capacitors, and resistors on a single chip. The evolution of chip designs continually involves faster circuitry and greater circuit density. The demands for faster circuits with greater circuit densities impose corresponding demands on the materials used to fabricate such integrated circuits. In particular, as the dimensions of integrated circuit components are reduced to the sub-micron scale, low resistivity conductive materials as well as low dielectric constant insulating materials are used to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer. Thus, a highly selective etchant enhances accurate pattern transfer.

As the pattern dimensions are reduced, the thickness of the energy sensitive resist is also correspondingly reduced in order to control pattern resolution. Such thin resist layers can be insufficient to mask underlying material layers during the pattern transfer process due to attack by the chemical etchant. An intermediate layer (e.g., silicon oxynitride, silicon carbine or carbon film), called a hardmask, is often used between the energy sensitive resist layer and the underlying material layers to facilitate pattern transfer because of greater resistance to the chemical etchant. Hardmask materials having both high etch selectivity and high deposition rates are targeted. As critical dimensions (CD) decrease, current hardmask materials lack the targeted etch selectivity relative to underlying materials and are often difficult to deposit.

Therefore, there is a need in the art for an improved hardmask layer and methods for depositing improved hardmask layers.

SUMMARY

Implementations of the present disclosure generally relate to hardmask films and methods for depositing hardmask films. More particularly, implementations of the present disclosure generally relate to tungsten carbide hardmask films and processes for depositing tungsten carbide hardmask films. In one implementation, a method of forming a tungsten carbide film is provided. The method comprises forming a tungsten carbide initiation layer on a silicon-containing surface of a substrate at a first deposition rate. The method further comprises forming a tungsten carbide film on the tungsten carbide initiation layer at a second deposition rate, wherein the second deposition rate is greater than the first deposition rate.

In another implementation, a method of forming a tungsten carbide film is provided. The method comprises forming a tungsten carbide initiation layer on a silicon-containing surface of a substrate at a first deposition rate, comprising exposing the silicon-containing surface to a first reactive gas comprising $WF_6$, $C_3H_6$, and optionally $H_2$ in a first PECVD process including a first RF plasma power of about 100 Watts or less at a first pressure in a range of about 2 Torr to about 10 Torr. The method further comprises forming a tungsten carbide film on the tungsten carbide initiation layer at a second deposition rate, comprising exposing the tungsten carbide initiation layer to a second reactive gas comprising $WF_6$, $C_3H_6$, and $H_2$ in a second PECVD process including a second RF plasma power of about 500 Watts or greater at a second pressure in a range of about 2 Torr to about 10 Torr. The second deposition rate is greater than the first deposition rate.

In yet another implementation, a method of forming a tungsten carbide film is provided. The method comprises forming a tungsten carbide initiation layer on a silicon-containing surface of a substrate at a first deposition rate, comprising exposing the silicon-containing surface to a first reactive gas comprising $WF_6$, $C_3H_6$, and optionally $H_2$ in a first PECVD process including a first RF plasma power of about 100 Watts or less at a first pressure in a range of about 2 Torr to about 10 Torr. The method further comprises forming a tungsten carbide film on the tungsten carbide initiation layer at a second deposition rate, comprising exposing the tungsten carbide initiation layer to a second reactive gas comprising $WF_6$, $C_3H_6$, and $H_2$ in a second PECVD process including a second RF plasma power of about 500 Watts or greater at a second pressure in a range of about 2 Torr to about 10 Torr. The second deposition rate is greater than the first deposition rate. The tungsten carbide initiation layer has a thickness in a range of about 10 Å to about 200 Å. The tungsten carbide film has a thickness greater than about 5,000 Å or greater.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes techniques for deposition of tungsten carbide (WC) hardmask films on a substrate. Certain details are set forth in the following description and in FIGS. 1-3C to provide a thorough understanding of various implementations of the disclosure. Other details describing well-known structures and systems often associated with plasma processing and hardmask deposition are not set forth in the following disclosure to avoid unnecessarily obscuring the description of the various implementations.

Many of the details, dimensions, angles, and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a PECVD process that can be carried out using any suitable thin film deposition system. Examples of suitable systems include the CENTURAO systems which may use a DXZO processing chamber, PRECISION 5000® systems, PRODUCER® systems, PRODUCER® GT™ systems, PRODUCER® XP PRECISION™ systems and PRODUCER® SE™ systems which are commercially available from Applied Materials, Inc., of Santa Clara, Calif. Other tools capable of performing PECVD processes may also be adapted to benefit from the implementations described herein. In addition, any system enabling the PECVD processes described herein can be used to advantage. The apparatus description described herein is illustrative and should not be construed or interpreted as limiting the scope of the implementations described herein.

Implementations of the present disclosure generally relate to hardmask films and methods for depositing hardmask films. More particularly, implementations of the present disclosure generally relate to tungsten carbide hardmask films and processes for depositing tungsten carbide hardmask films. Tungsten carbide films have been experimentally shown to have a high etch selectivity as a hardmask. However, use of tungsten carbide films faces several challenges. For example, tungsten carbide films adhere poorly to the underlying substrate (e.g., oxides, nitrides, or silicon). In addition, these tungsten carbide films adhere poorly to the surfaces of chamber components, which can lead to flaking of deposits during processing. One prior solution involved the use of a boron interfacial layer between the underlying substrate and the tungsten carbide film. However, the use of a different material layer such as a boron interfacial layer complicates subsequent etch chemistries. Another prior solution involved treating the underlying surface with hydrogen and nitrogen plasma prior to deposition of the tungsten carbide film. However, hydrogen proved to be corrosive to some chamber components leading to excessive defects in the deposited films. The implementations described herein enable the deposition of tungsten carbide hardmask films on oxide, nitride, or bare silicon surfaces by depositing a tungsten carbide initiation layer on the underlying surface. The tungsten carbide initiation layer is deposited at a lower deposition rate than the subsequently deposited tungsten carbide film. It has been surprisingly found by the inventors that deposition of the tungsten carbide initiation layer prior to deposition of the bulk tungsten carbide film significantly improves adhesion of the bulk tungsten carbide film to the underlying substrate. In addition, since the tungsten carbide initiation layer comprises the same materials as the bulk tungsten carbide film the same etch chemistry can be used to etch both the tungsten carbide initiation layer and the tungsten carbide bulk film. Thus, the tungsten carbide initiation layer described herein enables deposition of tungsten carbide films on a variety of substrates or layers, for example, oxides (e.g., $SiO_2$), nitrides (e.g., SiN), a-Si, oxide-nitride stacks, silicon, poly-silicon, with good adhesion.

Figure 1:
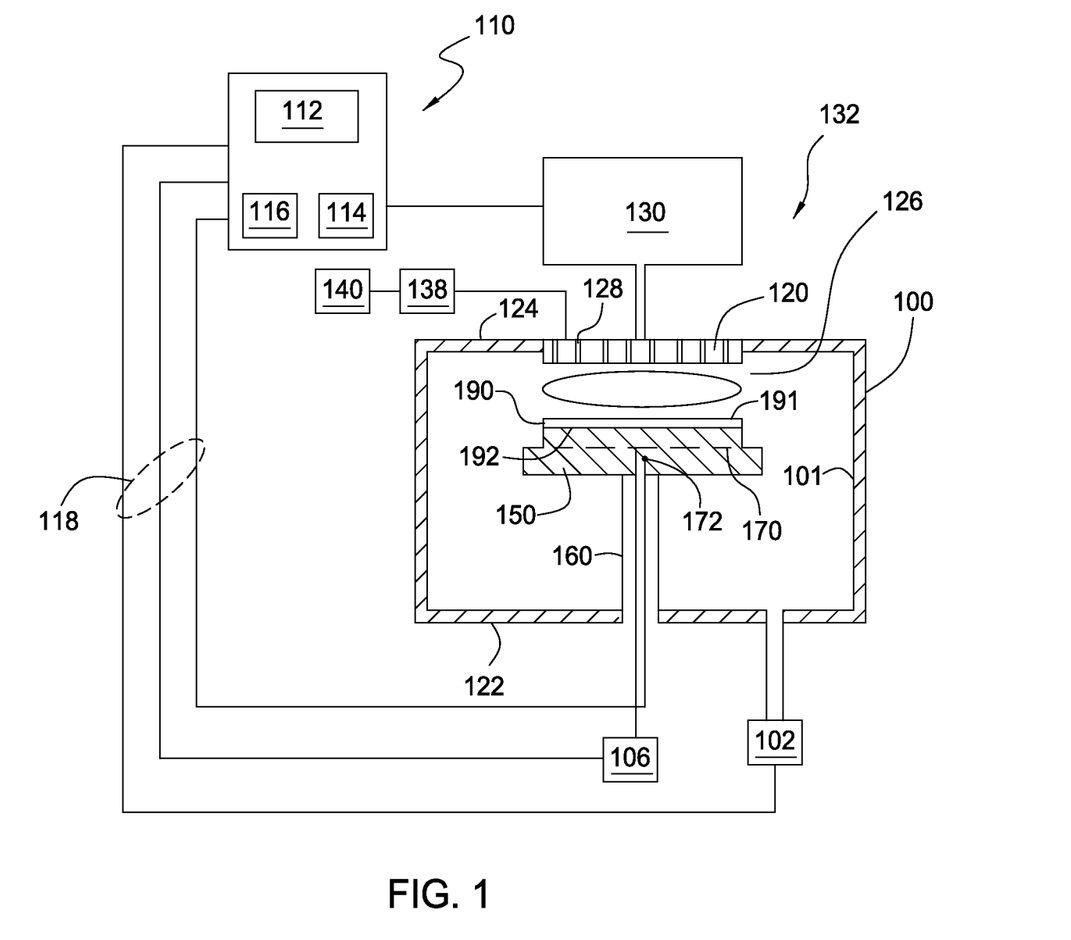
FIG. 1 depicts a schematic cross-sectional view of a PECVD system that can be used for the practice of implementations described herein.

FIG. 1 depicts a schematic cross-sectional view of a PECVD substrate processing system 132 that can be used for the practice of implementations described herein. The PECVD substrate processing system 132 includes a processing chamber 100 coupled to a gas panel 130 and a controller 110. The processing chamber 100 generally includes a top wall 124, a sidewall 101 and a bottom wall 122 that define a processing volume 126. A support pedestal 150 for supporting a substrate is provided in the processing volume 126 of the processing chamber 100. The support pedestal 150 is supported by a stem 160 and may be typically fabricated from aluminum, ceramic, and other suitable materials. The support pedestal 150 may be moved in a vertical direction inside the processing chamber 100 using a displacement mechanism (not shown).

The support pedestal 150 may include a heater element 170 suitable for controlling the temperature of a substrate 190 supported on a surface 192 of the support pedestal 150. The heater element 170 may be embedded in the support pedestal. The support pedestal 150 may be resistively heated by applying an electric current from a power supply 106 to the heater element 170. The heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thus maintaining the substrate 190 and the support pedestal 150 at a substantially constant temperature during film deposition. The supplied electric current may be adjusted to selectively control the temperature of the support pedestal 150 between about 100 degrees Celsius to about 700 degrees Celsius.

In some implementations, a temperature sensor 172, such as a thermocouple, is embedded in the support pedestal 150 to monitor the temperature of the support pedestal 150. The measured temperature is used by the controller 110 to control the power supplied to the heater element 170 to maintain the substrate at a targeted temperature.

A vacuum pump 102 is coupled to a port formed in the bottom of the processing chamber 100. The vacuum pump 102 is used to maintain a targeted gas pressure in the processing chamber 100. The vacuum pump 102 also evacuates post-processing gases and by-products of the process from the processing chamber 100.

The PECVD substrate processing system 132 may further include additional equipment for controlling the chamber pressure, for example, valves (e.g. throttle valves and isolation valves) positioned between the processing chamber 100 and the vacuum pump 102 to control the chamber pressure.

A showerhead 120 having a plurality of apertures 128 is disposed on the top of the processing chamber 100 above the support pedestal 150. The apertures 128 of the showerhead 120 are utilized to introduce process gases into the processing chamber 100. The apertures 128 may have different sizes, number, distributions, shape, design, and diameters to facilitate the flow of the various process gases for different process requirements. The showerhead 120 is connected to the gas panel 130 that allows various gases to supply to the processing volume 126 during processing. In one implementation, a plasma is formed from the process gas mixture exiting the showerhead 120 to enhance thermal decomposition of the process gases resulting in the deposition of material on a surface 191 of the substrate 190.

The showerhead 120 and support pedestal 150 may form a pair of spaced apart electrodes in the processing volume 126. One or more RF power sources 140 provide a bias potential through a matching network 138 to the showerhead 120 to facilitate generation of plasma between the showerhead 120 and the support pedestal 150. Alternatively, the RF power sources 140 and matching network 138 may be coupled to the showerhead 120, the support pedestal 150, or coupled to both the showerhead 120 and the support pedestal 150, or coupled to an antenna (not shown) disposed of exterior to the processing chamber 100. In one implementation, the RF power sources 140 may provide between about 100 Watts and about 3,000 Watts at a frequency of about 50 kHz to about 13.6 MHz. In another implementation, the RF power sources 140 may provide between about 500 Watts and about 1,800 Watts at a frequency of about 50 kHz to about 13.6 MHz.

The controller 110 includes a central processing unit (CPU) 112, a memory 116, and a support circuit 114 utilized to control the process sequence and regulate the gas flows from the gas panel 130. The CPU 112 may be of any form of a general-purpose computer processor that may be used in an industrial setting. The software routines can be stored in the memory 116, such as random access memory, read-only memory, floppy, or hard disk drive, or another form of digital storage. The support circuit 114 is coupled to the CPU 112 and may include cache, clock circuits, input/output systems, power supplies, and the like. Bi-directional communications between the controller 110 and the various components of the PECVD substrate processing system 132 are handled through numerous signal cables collectively referred to as signal buses 118, some of which are illustrated in FIG. 1.

Figure 2:
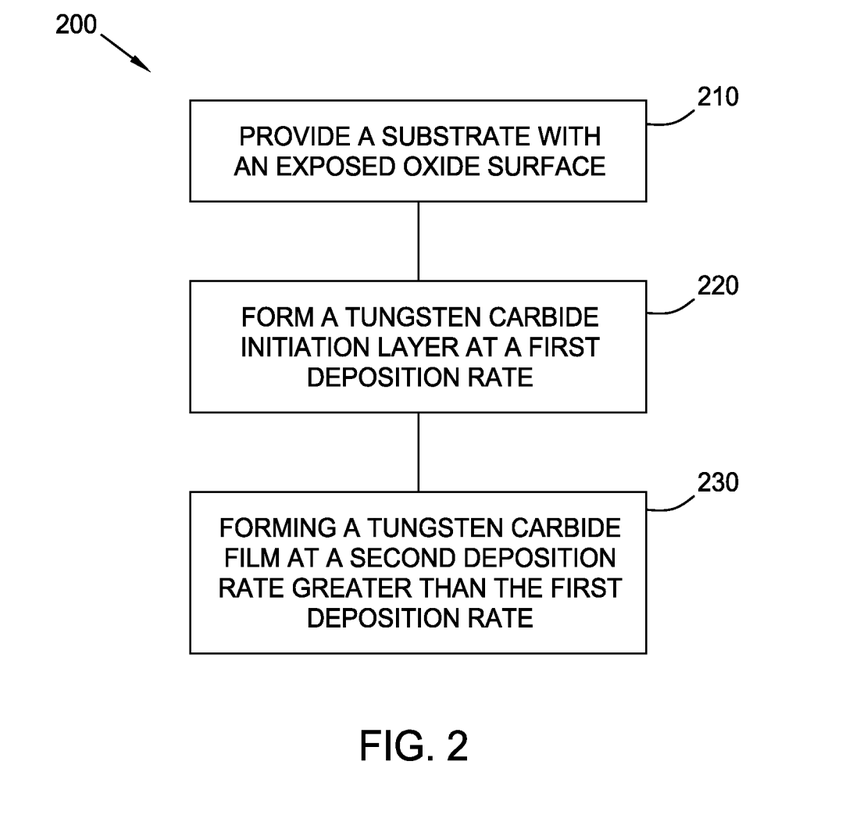
FIG. 2 depicts a flow diagram of a method for forming a tungsten carbide hardmask layer on a film stack disposed on a substrate in accordance with one implementation of the present disclosure.
Figure 3A:
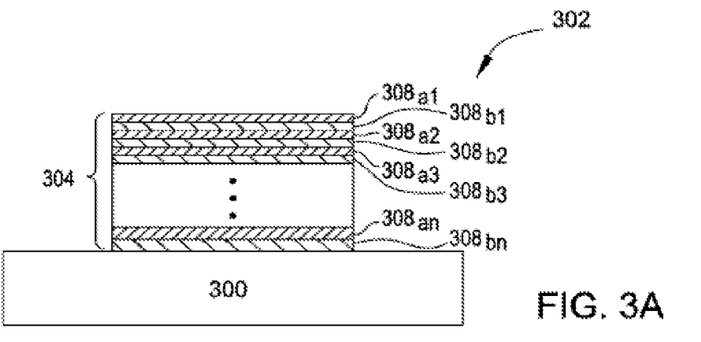
FIGS. 3A-3C depict one implementation of a sequence for forming a tungsten hardmask layer on a film stack formed on a substrate in accordance with the implementation shown in FIG. 2.
Figure 3B:
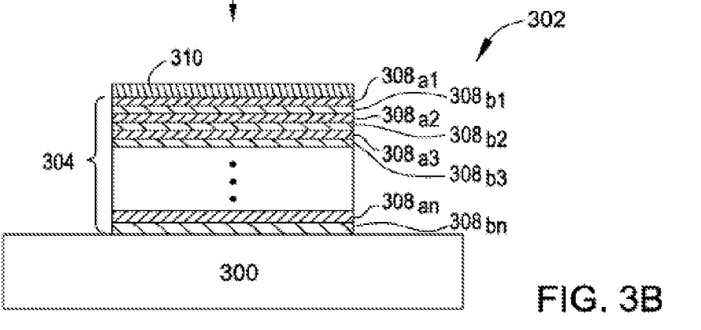
Figure 3C:
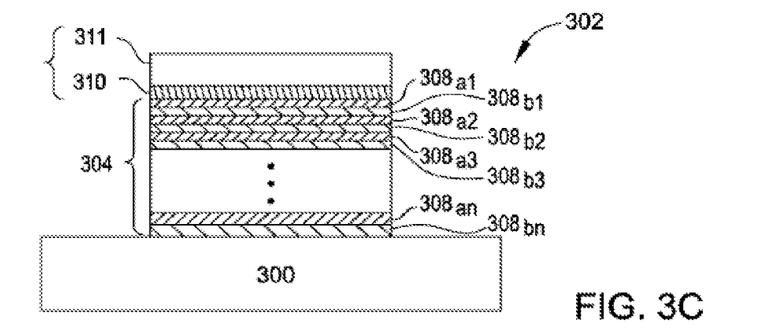

FIG. 2 depicts a flow diagram of a method 200 for forming a tungsten carbide hardmask layer on a film stack disposed on a substrate in accordance with one implementation of the present disclosure. The tungsten carbide hardmask layer formed on a film stack may be utilized, for example, to form stair-like structures in the film stack. FIGS. 3A-3C are schematic cross-sectional views illustrating a sequence for forming a tungsten carbide hardmask layer on a film stack disposed on a substrate according to the method 200. Although the method 200 is described below with reference to a hardmask layer that may be formed on a film stack utilized to manufacture stair-like structures in the film stack for three-dimensional semiconductor devices, the method 200 may also be used to advantage in other device manufacturing applications.

The method 200 begins at operation 210 by positioning a substrate, such as a substrate 300 depicted in FIG. 3A, into a processing chamber, such as the processing chamber 100 of the PECVD substrate processing system 132 depicted in FIG. 1. In one implementation, the substrate includes an exposed surface. In one implementation, the substrate 300 is similar to the substrate 190 depicted in FIG. 1. In some implementations, the exposed surface is selected from an exposed oxide surface (e.g., $SiO_2$), an exposed nitride surface (e.g., SiN), an exposed a-Si surface, an oxide-nitride stack, an exposed silicon surface, or an exposed polysilicon surface. In one implementation, the exposed surface is an oxide surface. The oxide surface can be any suitable oxide including, but not limited to, silicon oxide. In some implementations, the substrate comprises silicon and the oxide surface comprises silicon oxide. The oxide surface can be a native oxide or a grown oxide. For example, the surface may form a native oxide due to exposure to air or can be oxidized to form an oxide film with a predetermined thickness. In one implementation, the exposed surface is a nitride surface. The nitride surface can be any suitable nitride including, but not limited to, silicon nitride.

In one implementation, the substrate 300 may be positioned on a support pedestal, for example, the surface 192 of the support pedestal 150. The substrate 300 may be a silicon-based material or any suitable insulating material or conductive material as needed, having a film stack 304 disposed on the substrate 300 that may be utilized to form a structure 302, such as stair-like structures, in the film stack 304.

As shown in the exemplary implementation depicted in FIG. 3A, the substrate 300 may have a substantially planar surface, an uneven surface, or a substantially planar surface having a structure formed thereon. The film stack 304 is formed on the substrate 300. In one implementation, the film stack 304 may be utilized to form a gate structure, a contact structure or an interconnection structure in a front end or back end process. The method 200 may be performed on the film stack 304 to form the stair-like structures therein used in a memory structure, such as NAND structure. In one implementation, the substrate 300 may be a material such as crystalline silicon (e.g., Si<100> or Si<111>), silicon oxide, strained silicon, silicon germanium, doped or undoped polysilicon, doped or undoped silicon substrates and patterned or non-patterned substrates silicon on insulator (SOI), carbon doped silicon oxides, silicon nitride, doped silicon, germanium, gallium arsenide, glass, sapphire. The substrate 300 may have various dimensions, such as 200-mm, 300-mm, and 450-mm or other diameter substrates, as well as, rectangular or square panels. Unless otherwise noted, implementations and examples described herein are conducted on substrates with a 200-mm diameter, a 300-mm diameter, or a 450-mm diameter substrate. In one implementation where a SOI structure is utilized for the substrate 300, the substrate 300 may include a buried dielectric layer disposed on a silicon crystalline substrate. In the implementation depicted herein, the substrate 300 may be a crystalline silicon substrate.

In one implementation, the film stack 304 disposed on the substrate 300 may have a number of vertically stacked layers. The film stack 304 may comprise pairs including a first layer (shown as $308a_1$, $308a_2$, $308a_3$, ..., $308a_n$) and a second layer (shown as $308b_1$, $308b_2$, $308b_3$, ..., $308b_n$) repeatedly formed in the film stack 304. The pairs include alternating first layer (shown as $308a_1$, $308a_2$, $308a_3$, ..., $308a_n$) and second layer (shown as $308b_1$, $308b_2$, $308b_3$, ..., $308b_n$) repeatedly formed until targeted numbers of pairs of the first layers and the second layers are reached.

The film stack 304 may be a part of a semiconductor chip, such as a three-dimensional memory chip. Although three repeating layers of first layers (shown as $308a_1$, $308a_2$, $308a_3$, ..., $308a_n$) and second layers (shown as $308b_1$, $308b_2$, $308b_3$, ..., $308b_n$) are shown in FIGS. 3A-3C, it is noted that any targeted number of repeating pairs of the first and the second layers may be utilized as needed.

In one implementation, the film stack 304 may be utilized to form multiple gate structures for a three-dimensional memory chip. The first layers $308a_1$, $308a_2$, $308a_3$, ..., $308a_n$ formed in the film stack 304 may be a first dielectric layer and the second layers $308b_1$, $308b_2$, $308b_3$, ..., $308b_n$ may be a second dielectric layer. Suitable dielectric layers may be utilized to form the first layers $308a_1$, $308a_2$, $308a_3$, ..., $308a_n$ and the second layer $308b_1$, $308b_2$, $308b_3$, ..., $308b_n$ include silicon oxide, silicon nitride, silicon oxynitride, silicon carbide, silicon oxycarbide, titanium nitride, composite of oxide and nitride, at least one or more oxide layers sandwiching a nitride layer, and combinations thereof, among others. In some implementations, the dielectric layers may be a high-k material having a dielectric constant greater than 4. Suitable examples of the high-k materials include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others.

In one particular example, the first layers $308a_1$, $308a_2$, $308a_3$, ..., $308a_n$ are silicon oxide layers and the second layers $308b_1$, $308b_2$, $308b_3$, ..., $308b_n$ are silicon nitride layers or polysilicon layers disposed on the first layers $308a_1$, $308a_2$, $308a_3$, ..., $308a_n$. In one implementation, the thickness of first layers $308a_1$, $308a_2$, $308a_3$, ..., $308a_n$ may be controlled at between about 50 Å and about 1000 Å, such as about 500 Å, and the thickness of each of the second layers $308b_1$, $308b_2$, $308b_3$, ..., $308b_n$ may be controlled at between about 50 Å and about 1000 Å, such as about 500 Å. The film stack 304 may have a total thickness between about 100 Å and about 2000 Å. In one implementation, the total thickness of the film stack 304 is about 3 microns to about 10 microns and will vary as technology advances.

It is noted that the hardmask layer may be formed on any surfaces or any portion of the substrate 300 with or without the film stack 304 present on the substrate 300.

At operation 220, a tungsten carbide initiation layer, such as a tungsten carbide initiation layer 310, is formed over the substrate, such as the substrate 300. The tungsten carbide initiation layer 310 is formed at a first deposition rate that is lower than the deposition rate of the subsequently deposited tungsten carbide film. In one implementation, the tungsten carbide initiation layer 310 is deposited at a deposition rate of 20 Å/second or less, of 15 Å/second or less, of 10 Å/second or less, of 5 Å/second or less, or of 2 Å/second or less. In one implementation, the tungsten carbide initiation layer 310 is deposited at a deposition rate of between about 2 Å/second and about 20 Å/second (e.g., between about 5 Å/second and about 15 Å/second; or between about 5 Å/second and about 10 Å/second). The inventors have surprisingly found that formation of the tungsten carbide initiation layer 310 at a low deposition rate improves adhesion of the subsequently deposited tungsten carbide film 311 to the underlying silicon-containing surface (e.g., silicon oxide). The tungsten carbide film 311 was observed not to form well on the underlying silicon-containing surface without the tungsten carbide initiation layer 310.

In some implementations, the tungsten carbide initiation layer 310 comprises a tungsten carbide film on top of the silicon-containing surface, such as the oxide surface of the first layer $308a_1$. Those skilled in the art will understand that the bottom portion of the tungsten carbide initiation layer 310 may diffuse with the top of the oxide surface.

In one or more implementations, the underlying silicon-containing layer is exposed to a reactive gas comprising a mixture of $WF_6$, Ar, and $C_3H_6$ and optionally $H_2$ that are co-flowed into a process region of a processing chamber under the presence of a plasma. The reactive gas used to form the tungsten carbide initiation layer 310 may be referred to as a first reactive gas to distinguish the gas composition and conditions from other reactive gas processes. The $C_3H_6$ flow can be ramped up from no flow to a predetermined value within the first few seconds of the process. The $WF_6$ flow can be ramped up from no flow to a predetermined value within the first few seconds of the process. The atomic percent of tungsten in the tungsten carbide hardmask can be tuned by varying the ratio of $C_3H_6:WF_6$ during the process. In some implementations, the $C_3H_6$ and the $WF_6$ in the first reactive gas are present in a ratio ($C_3H_6:WF_6$) of 2:1 or greater. In some implementations, the $C_3H_6$ and $WF_6$ in the first reactive gas are present in a ratio ($C_3H_6:WF_6$) in a range of about 2:1 to about 10:1, or in the range of about 10:1 to about 50:1, or in the range of about 15:1 to about 30:1, or about 20:1.

In some implementations, the flow of $C_3H_6$ in the first reactive gas is ramped up to a final predetermined flow rate over a time in the range of about 2 seconds to about 100 seconds. In some implementations, the flow of $C_3H_6$ is ramped to a predetermined value in about 8 seconds, 7 seconds, 6 seconds, 5 seconds, 4 seconds, or 3 seconds.

In some implementations, the flow of $WF_6$ in the first reactive gas is ramped up to a final predetermined flow rate over a time in the range of about 1 second to about 60 seconds (e.g., from about 2 seconds to about 10 seconds). In some implementations, the flow of $WF_6$ is ramped to a predetermined value in about 8 seconds, 7 seconds, 6 seconds, 5 seconds, 4 seconds, or 3 seconds.

The PECVD process used to deposit the tungsten carbide initiation layer 310 includes RF plasma generated at a predetermined frequency with a predetermined power and pressure. The plasma frequency can be any suitable frequency including, but not limited to, 2 MHz, 13.56 MHz, 40 MHz, 60 MHz and 100 MHz. In some implementations, the plasma frequency is about 13.56 MHz.

In some implementations, the power of the RF plasma used to deposit the tungsten carbide initiation layer 310 is less than about 1000 Watts. In some implementations, any of the PECVD process stages use an RF power in the range of about 100 Watts to about 900 Watts, or in the range of about 200 Watts to about 800 Watt, or in the range of about 300 Watts to about 700 Watts, or in the range of about 400 Watts to about 600 Watts. In some implementations, the RF power is about 500 Watts.

The pressure in the process region can be any suitable process pressure. For example, the pressure may be in the range of about 1 Torr to about 50 Torr. In some implementations, the pressure is in the range of about 2 Torr to about 10 Torr. In one or more implementations, the pressure is greater than 1 Torr and is less than 50 Torr, 40 Torr, 30 Torr or 20 Torr.

The underlying silicon-containing surface can be exposed to the RF plasma for any suitable time depending on, for example, the process conditions and the predetermined thickness of the tungsten carbide initiation layer 310 being deposited. In some implementations, the underlying silicon-containing surface is exposed to the PECVD process for a time in the range of about 1 second to about 60 seconds (e.g., about 1 second to about 30 seconds.) In some implementations, the underlying silicon-containing surface is exposed to the PECVD process for about 10 seconds to form the tungsten carbide initiation layer 310.

The thickness of the tungsten carbide initiation layer 310 can vary depending on, for example, the predetermined thickness of the tungsten carbide film 311 to be deposited. In some implementations, the tungsten carbide initiation layer 310 has a thickness in the range of about 10 Å to about 200 Å. In one or more implementations, the tungsten carbide initiation layer 310 has a thickness in the range of about 10 Å to about 100 Å. In various implementations, the tungsten carbide initiation layer 310 has a thickness less than about 200 Å, 150 Å, 100 Å or 75 Å. In some implementations, the tungsten carbide initiation layer 310 has a thickness greater than about 10 Å, 20 Å, 30 Å, 40 Å, 50 Å, 60 Å, 70 Å, 80 Å, 90 Å or 100 Å.

At operation 230, a tungsten carbide film, such as the tungsten carbide film 311, is formed on the tungsten carbide initiation layer, such as the tungsten carbide initiation layer 310. The tungsten carbide film 311 is also referred to as a hardmask layer. The tungsten carbide film 311 is formed at a second deposition rate that is greater than the first deposition rate of the previously deposited tungsten carbide initiation layer 310. In one implementation, the tungsten carbide film 311 is deposited at a deposition rate of 30 Å/second or more, of 35 Å/second or more, of 40 Å/second or more, of 45 Å/second or more, or of 50 Å/second or more. In one implementation, the tungsten carbide film 311 is deposited at a deposition rate of between about 30 Å/second and about 50 Å/second (e.g., between about 30 Å/second and about 40 Å/second; or between about Å/second and about 10 Å/second). In one implementation, a ratio of the second deposition rate to the first deposition rate is 2:1 or greater, 3:1 or greater, 4:1 or greater, or 5:1 or greater. In one implementation, a ratio of the second deposition rate to the first deposition rate in the range of about 3:1 to about 5:1, or in the range of about 3:1 to about 4:1, or about 3:1.

In some implementations, the tungsten carbide film 311 can be formed by a second reactive gas made by co-flowing $WF_6$, Ar, and $C_3H_6$ and optionally $H_2$ under the presence of RF plasma. The reactive gas used to form the tungsten carbide film 311 may be referred to as a second reactive gas to distinguish the gas composition and conditions from other reactive gas processes. The atomic percent tungsten in the tungsten carbide film 311 can be tuned by varying the ratio of $C_3H_6:WF_6$ during the process. In some implementations, the $C_3H_6$ and the $WF_6$ in the second reactive gas are present in a ratio ($C_3H_6:WF_6$) of 2:1 or greater. In some implementations, the $C_3H_6$ and the $WF_6$ in the second reactive gas are present in a ratio ($C_3H_6:WF_6$) in a range of about 2:1 to about 10:1, or in the range of about 10:1 to about 50:1, or in the range of about 15:1 to about 30:1, or about 20:1.

The PECVD process used to deposit the tungsten carbide film 311 includes an RF plasma generated at a predetermined frequency with a predetermined power and pressure. The plasma frequency can be any suitable frequency including, but not limited to, 2 MHz, 13.56 MHz, 40 MHz, 60 MHz and 100 MHz. In some embodiments, the plasma frequency is about 13.56 MHz.

In some embodiments, the power of the RF plasma used to deposit the tungsten carbide film 311 is less than about 1000 Watts. In some embodiments, any of the PECVD process stages use an RF power in the range of about 100 Watt to about 900 Watt, or in the range of about 200 Watt to about 800 Watt, or in the range of about 300 Watt to about 700 Watt, or in the range of about 400 Watt to about 600 Watt. In some embodiments, the RF power is about 500 Watts.

The pressure of the RF plasma can be any suitable process pressure. For example, the pressure may be in the range of about 1 Torr to about 50 Torr. In some embodiments, the pressure is in the range of about 2 Torr to about 10 Torr. In one or more embodiments, the pressure is greater than or equal to about 1 Torr and is less than or equal to about 50 Torr, 40 Torr, 30 Torr or 20 Torr.

The tungsten carbide initiation layer 310 can be exposed to the RF plasma for any suitable time depending on, for example, the process conditions and the predetermined thickness of the tungsten carbide film 311 being deposited. In some implementations, the tungsten carbide initiation layer 310 is exposed to the PECVD process for a time in the range of about 1 second to about 60 seconds (e.g., from about 1 second to about 30 seconds.) In some implementations, the tungsten carbide initiation layer 310 is exposed to the PECVD process for about 10 seconds to form the tungsten carbide film 311.

The thickness of the tungsten carbide film 311 can be varied depending on, for example, the process conditions of the tungsten-containing film deposition. In some implementations, the tungsten carbide film 311 has a thickness greater than or equal to about 1000 Å, 2000 Å, 3000 Å, 4000 Å 5000 Å, 6000 Å, 7000 Å, 8000 Å, 9000 Å or 10000 Å. In one implementation, the tungsten carbide film 311 has a thickness greater than about 5,000 Å or greater. In one implementation, the tungsten carbide film 311 has a thickness in the range of about 5,000 Å to about 12,000 Å.

The temperature at which each of the process stages occurs can be the same or different from any other process stage. The temperature can be varied depending on, for example, the thermal budget of the device being formed. In some implementations, formation of the tungsten carbide initiation layer 310 and the tungsten carbide film 311 occurs at a temperature in the range of about 100 degrees Celsius to about 700 degrees Celsius, or in the range of about 200 degrees Celsius to about 600 degrees Celsius, or in the range of about 400 degrees Celsius to about 550 degrees Celsius, or about 450 degrees Celsius.

After the tungsten carbide film 311 is formed, the tungsten carbide film 311 may be utilized in an etching process as a patterning mask to form a three-dimensional structure, such as a stair-like structure.

Thus, methods for forming a tungsten carbide hardmask layer that may be utilized to form stair-like structures for manufacturing three-dimensional stacking of semiconductor devices is provided. The tungsten carbide hardmask layer may include a tungsten carbide initiation layer and a bulk tungsten carbide film that provide a bonding structure with low surface roughness and improved adhesion at the interface between the underlying substrate and the tungsten carbide hardmask layer. By utilization of the tungsten carbide hardmask layer with targeted robust film properties and etching selectivity, an improved dimension and profile control of the resultant structures formed in a film stack may be obtained and the electrical performance of the chip devices enhanced in applications for three-dimensional stacking of semiconductor structures.

In summary, some implementations described herein enable the deposition of tungsten carbide hardmask films on oxide, nitride, or bare silicon surfaces by depositing a tungsten carbide initiation layer on the underlying surface. The tungsten carbide initiation layer is deposited at a lower deposition rate than the subsequently deposited tungsten carbide film. Deposition of the tungsten carbide initiation layer prior to deposition of the bulk tungsten carbide film significantly improves adhesion of the bulk tungsten carbide film to the underlying substrate. In addition, since the tungsten carbide initiation layer comprises the same materials as the bulk tungsten carbide film the same etch chemistry can be used to etch both the tungsten carbide initiation layer and the tungsten carbide bulk film. Thus, the tungsten carbide initiation layer described herein enables deposition of tungsten carbide films on a variety of substrates or layers, for example, oxides (e.g., $SiO_2$), nitrides (e.g., SiN), a-Si, oxide-nitride stacks, silicon, poly-silicon, with good adhesion.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method of forming a tungsten carbide film, comprising:
    forming, by plasma-enhanced chemical vapor deposition (PECVD), a tungsten carbide initiation layer directly on a silicon-containing surface of a substrate at a first deposition rate; and
    forming a tungsten carbide film on the tungsten carbide initiation layer at a second deposition rate, wherein the second deposition rate is greater than the first deposition rate.

2. The method of claim 1, wherein a ratio of the second deposition rate to the first deposition rate is 3:1 or greater.

3. The method of claim 2, wherein the second deposition rate is 30 Å/second or greater and the first deposition rate is 10 Å/second or less.

4. The method of claim 3, wherein the second deposition rate is in a range of about 30 Å/second to about 40 Å/second and the first deposition rate is in a range of about 5 Å/second to about 10 Å/second.

5. The method of claim 1, wherein the tungsten carbide initiation layer has a thickness in a range of about 10 Å to about 200 Å.

6. The method of claim 5, wherein the tungsten carbide film has a thickness of about 5,000 Å or greater.

7. The method of claim 6, wherein forming the tungsten carbide initiation layer comprises exposing the silicon-containing surface to a first reactive gas comprising $WF_6$, $C_3H_6$, and optionally $H_2$ in a first PECVD process including a first RF plasma power of about 100 Watts or less at a first pressure in a first range of about 2 Torr to about 10 Torr.

8. The method of claim 7, wherein the $WF_6$ and $C_3H_6$ in the first reactive gas are present in a ratio of 2:1 or greater.

9. The method of claim 7, wherein forming the tungsten carbide film comprises exposing the tungsten carbide initiation layer to a second reactive gas comprising $WF_6$, $C_3H_6$, and optionally $H_2$ in a second PECVD process including a second RF plasma power of about 500 Watts or greater at a second pressure in a second range of about 2 Torr to about 10 Torr.

10. The method of claim 1, wherein the silicon-containing surface comprises silicon oxide, silicon nitride, or combinations thereof.

11. A method of forming a tungsten carbide film, comprising:
    forming a tungsten carbide initiation layer directly on a silicon-containing surface of a substrate at a first deposition rate, comprising exposing the silicon-containing surface to a first reactive gas comprising $WF_6$, $C_3H_6$, and $H_2$ in a first PECVD process including a first RF plasma power of about 100 Watts or less at a first pressure in a range of about 2 Torr to about 10 Torr; and
    forming a tungsten carbide film on the tungsten carbide initiation layer at a second deposition rate, comprising exposing the tungsten carbide initiation layer to a second reactive gas comprising $WF_6$, $C_3H_6$, and optionally $H_2$ in a second PECVD process including a second RF plasma power of about 500 Watts or greater at a second pressure in a range of about 2 Torr to about 10 Torr, wherein the second deposition rate is greater than the first deposition rate.

12. The method of claim 11, wherein a ratio of the second deposition rate to the first deposition rate is 3:1 or greater.

13. The method of claim 12, wherein the second deposition rate is 30 Å/second or greater and the first deposition rate is 10 Å/second or less.

14. The method of claim 13, wherein the second deposition rate is in a range of about 30 Å/second to about 40 Å/second and the first deposition rate is in a range of about 5 Å/second to about 10 Å/second.

15. The method of claim 11, wherein the tungsten carbide initiation layer has a thickness in a range of about 10 Å to about 200 Å.

16. A method of forming a tungsten carbide film, comprising:
    forming a tungsten carbide initiation layer directly on a silicon-containing surface of a substrate at a first deposition rate, comprising exposing the silicon-containing surface to a first reactive gas comprising $WF_6$, $C_3H_6$, and $H_2$ in a first PECVD process including a first RF plasma power of about 100 Watts or less at a first pressure in a range of about 2 Torr to about 10 Torr; and
    forming a tungsten carbide film on the tungsten carbide initiation layer at a second deposition rate, comprising exposing the tungsten carbide initiation layer to a second reactive gas comprising $WF_6$, $C_3H_6$, and optionally $H_2$ in a second PECVD process including a second RF plasma power of about 500 Watts or greater at a second pressure in a range of about 2 Torr to about 10 Torr,
    wherein the second deposition rate is greater than the first deposition rate,
    wherein the tungsten carbide initiation layer has a thickness in a range of about 10 Å to about 200 Å, and
    wherein the tungsten carbide film has a thickness of about 5,000 Å or greater.

17. The method of claim 16, wherein the $WF_6$ and $C_3H_6$ in the first reactive gas are present in a ratio of 2:1 or greater.

18. The method of claim 17, wherein a ratio of the second deposition rate to the first deposition rate is 3:1 or greater.

19. The method of claim 18, wherein the second deposition rate is 30 Å/second or greater and the first deposition rate is 10 Å/second or less.

20. The method of claim 19, wherein the second deposition rate is in a range of about 30 Å/second to about 40 Å/second and the first deposition rate is in a range of about 5 Å/second to about 10 Å/second.

\* \* \* \* \*